(12) United States Patent
Stern

(10) Patent No.: US 6,998,328 B2
(45) Date of Patent: Feb. 14, 2006

(54) METHOD FOR CREATING NEO-WAFERS FROM SINGULATED INTEGRATED CIRCUIT DIE AND A DEVICE MADE ACCORDING TO THE METHOD

(75) Inventor: Jonathan Michael Stern, Laguna Beach, CA (US)

(73) Assignee: Irvine Sensors Corp., Costa Mesa, CA (US)

( * ) Notice: Subject to any disclaimer, the term of this patent is extended or adjusted under 35 U.S.C. 154(b) by 0 days.

(21) Appl. No.: 10/701,783

(22) Filed: Nov. 5, 2003

(65) Prior Publication Data

US 2004/0140533 A1 Jul. 22, 2004

Related U.S. Application Data

(60) Provisional application No. 60/424,025, filed on Nov. 6, 2002.

(51) Int. Cl.
*H01L 21/30* (2006.01)
*H01L 21/46* (2006.01)

(52) U.S. Cl. .................. 438/455; 438/459; 438/462

(58) Field of Classification Search ............... 438/110, 438/112, 125, 126, 459, 460, 462, 455; 257/620, 257/687

See application file for complete search history.

(56) References Cited

U.S. PATENT DOCUMENTS

| | | | | |
|---|---|---|---|---|
| 6,507,119 B2 * | 1/2003 | Huang et al. | ............... | 257/778 |
| 6,541,352 B2 * | 4/2003 | Wachtler | .................... | 438/460 |
| 6,548,330 B1 * | 4/2003 | Murayama et al. | ......... | 438/127 |
| 6,573,592 B2 * | 6/2003 | Bolken | ....................... | 257/687 |
| 6,881,648 B2 * | 4/2005 | Chen et al. | ................. | 438/459 |
| 2002/0096743 A1 * | 7/2002 | Spooner et al. | ............. | 257/620 |
| 2003/0127735 A1 * | 7/2003 | Pepe et al. | .................. | 257/737 |
| 2003/0183950 A1 * | 10/2003 | Bolken | ....................... | 257/786 |
| 2003/0194832 A1 * | 10/2003 | Lopata et al. | ............... | 438/108 |
| 2004/0104408 A1 * | 6/2004 | Moden et al. | .............. | 257/200 |
| 2004/0155325 A1 * | 8/2004 | Ma et al. | .................... | 257/678 |
| 2004/0178515 A1 * | 9/2004 | Hilton et al. | ............... | 257/787 |

* cited by examiner

*Primary Examiner*—W. David Coleman
*Assistant Examiner*—Khiem Nguyen
(74) *Attorney, Agent, or Firm*—W. Eric Boyd

(57) ABSTRACT

A neo-wafer made from integrated circuit die and methods for making a neo-wafer are disclosed. Recesses are formed on a substrate and a dielectric layer with conductive pads is created for the receiving of one or more die. Die are flip-chip bonded to the conductive pads and all voids under-filled. The neo-wafer is thinned to expose the dielectric and the conductive pads exposed, creating a neo-wafer.

6 Claims, 4 Drawing Sheets

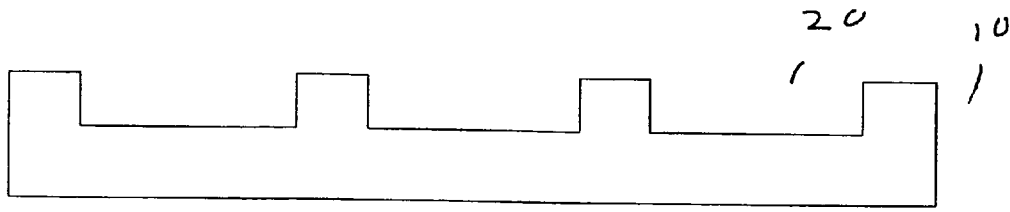
Fig. 1
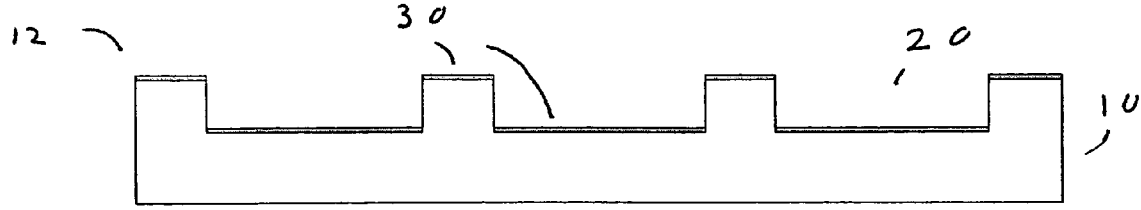
Fig. 2
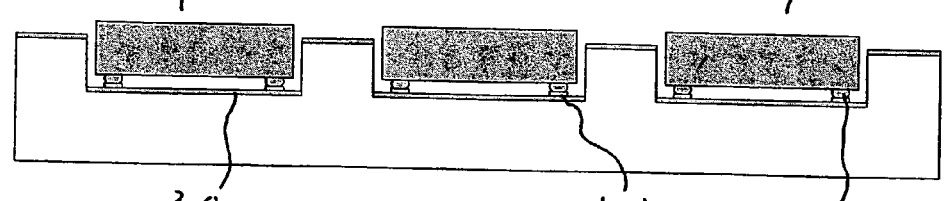
Fig. 3
Fig. 4

METHOD FOR CREATING NEO-WAFERS FROM SINGULATED INTEGRATED CIRCUIT DIE AND A DEVICE MADE ACCORDING TO THE METHOD

CROSS REFERENCE TO RELATED APPLICATIONS

This application is related to U.S. Provisional patent application Ser. No. 60/424,025, filed on Nov. 6, 2002, which is incorporated herein by reference and to which priority is claimed pursuant to 35 USC 119.

STATEMENT REGARDING FEDERALLY SPONSORED RESEARCH AND DEVELOPMENT

N/A

BACKGROUND OF THE INVENTION

1. Field of the Invention

The invention generally relates to creating wafers from singulated integrated circuit die. Specifically, the invention relates to methods for creating a standard geometry "neo-wafer" from previously singulated integrated circuit die and to a neo-wafer created according to the methods. The invention is thus an enabling technology with respect to neo-wafers that contain all know good die (KGD).

2. Description of the Prior Art

Microelectronic packages typically include an integrated circuit die formed on a semiconductor material, which as been bonded to a lead frame and encapsulated in a plastic material. The integrated circuit die themselves are manufactured by creating multiple, individual die on a single, standard geometry semiconductor wafer using well known industry techniques. After manufacturing and testing of the die at the wafer level, the individual die are diced, or singulated, for use in a variety of microelectronic package formats.

There is a need in the industry to recreate standard geometry neo-wafers from die that have previously been singulated from the original semiconductor wafer. Applications for neo-wafers include uses in wafer-scale integration, manufacturing of multi-chip modules, wafer-scale, three-dimensional packaging, and in processes requiring build up of non-silicon based circuitry on the surface of a previously tested wafer.

In the case of wafer-scale integration, there is a requirement that the wafer contain only tested and fully functional die and that no failed die exist on the wafer. Present wafer manufacturing techniques make 100% die yield on a single wafer generally unattainable.

In the field of multi-chip module manufacturing, the object of the invention is to provide a neo-wafer with a heterogeneous mix of die, potentially manufactured using different processes and foundries.

Neo-wafers incorporating heterogeneous or homogeneous die are also beneficially used in wafer-scale, three-dimensional packaging where wafers containing integrated circuit die are stacked, diced and the individual layers interconnected to form high-density electronic modules. In such applications, 100% die yields are desirable on each wafer in the stack to ensure a failed individual die does not result in making the entire stacked module in which it is incorporated useless.

Finally, the process of non-silicon circuit build up necessitates the reassembly of fully functional individual die into a wafer so that wafer level processes, such as deposition, lithography, and doping, can be performed on the surface of the rewafered die.

Unfortunately, there is presently no reliable method of creating neo-wafers, particularly because of the problem of singulated die alignment on the neo-wafer. It is desirable that the die incorporated into the neo-wafer be aligned and oriented with the same degree of accuracy as found in conventional wafers before die singulation.

It is therefore an object of the disclosed invention to address the singulated die alignment problem while creating a neo-wafer that is compatible with industry standard wafer level processes that can be handled and processed in the same manner as a standard, non-singulated, semiconductor wafer.

BRIEF SUMMARY OF THE INVENTION

The illustrated embodiments of the invention generally comprise the creation of one or more recesses in a sacrificial substrate of the desired neo-wafer diameter. A dielectric layer is deposited within the recesses and conductive pads are created thereon for the receiving and electrical interconnection of one or more singulated die. The die are flip-chip bonded to the conductive pads and all voids between the recess surfaces of the substrate and die are under-filled. The neo-wafer is planerized on the die side and then back-thinned to expose the dielectric layer that was originally deposited in the recesses. This planerizing/backthinning step results in a neo-wafer of the desired wafer thickness. The dielectric layer is selective removed to expose the conductive pads, creating a neo-wafer.

An alternative embodiment of the invention includes the formation of dielectric structures on a first layer of the desired wafer diameter. Conductive pads are formed on the dielectric structures and are patterned as appropriate for the receiving and electrical interconnection of one or more singulated die.

The above alternative embodiment further includes providing a second layer and a third layer, each bonded to the other with an adhesive and each of the desired wafer diameter. Regions are selectively removed in the third layer and any exposed adhesive removed. Sidewall structures are then formed in the second layer of predetermined size and pitch so as to allow the uppermost surface of the sidewall structures to align and be bonded to the first layer across and generally interlocking with the formed dielectric structures thereon. The remaining portions of the third layer and residual adhesive are selectively removed from the second layer, leaving one or more well-defined recesses each including a dielectric structure and conductive pads formed therein. The neo-wafer may be assembled and processed in the same manner as discussed above.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals among the several views.

BRIEF DESCRIPTION OF THE DRAWINGS

FIGS. 1–3 show cross-sections of the invention illustrating recesses formed a substrate with a dielectric layer and conductive pads formed therein.

FIG. 4 illustrates a cross-section of the invention with previously singulated die disposed within the recesses.

Figure 5:
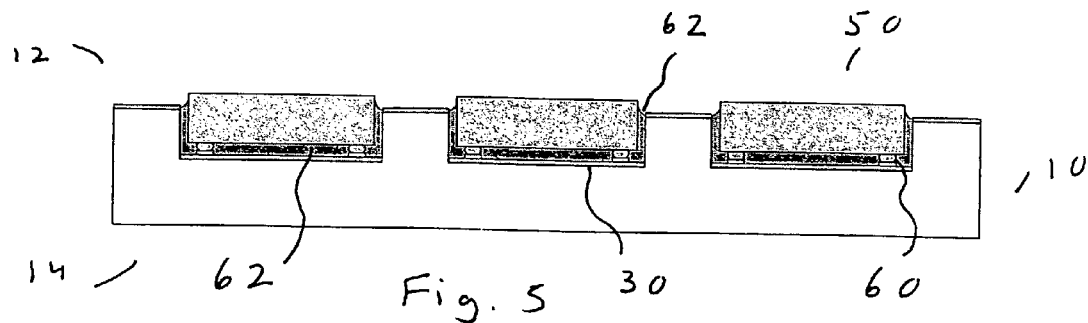
FIG. 5 shows a cross-section of the invention after under-fill.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Turning now to FIG. 1, a sacrificial substrate 10, with a first surface 12 and a second surface 14 is provided. One or more recesses 20 are defined in first surface 12 for the receiving of an integrated circuit die. Substrate 10 is preferably photo-imagable glass such as FORTURAN, available from Schott Corp., which is capable of achieving very small etch angles. Alternatively, a quartz substrate may be used. The diameter and geometry of substrate 10 should be that of the desired end wafer diameter and geometry.

Recesses 20 are provided with a length and width slightly greater than that of the die which will be incorporated into recesses 20 to minimize the quantity of organic material in the wafer after under-fill. The depth of recesses 20 is preferably slightly less than the sum of the thickness of the die and solder ball height to be incorporated into recesses 20 to allow subsequent planarization of first surface 12 as is discussed below. Conventional photolithographic techniques are used to create recesses 20 as are well known in the art.

As illustrated in FIG. 2, a layer of dielectric material 30 such as a polyamide, or vacuum deposited material such as silicon nitride, is applied upon the interior surfaces of recesses 20. Dielectric 30 should be a material that is compatible with high temperature processes. Alternative methods of depositing dielectric layer 30 include inkjet printing or pad printing.

FIG. 3 shows the step of metalization applied to dielectric 30 to form conductive pads 40. Pads 40 are formed so as to substantially match the I/O pad size and location on the die that will be incorporated into recesses 20. Precise pad placement is important to ensure final die alignment on the neo-wafer.

As illustrated in FIG. 4, one or more integrated circuit die 50 are provided with solder balls 60 applied to the desired I/O pads on die 50. Die 50 are aligned on pads 40 within recesses 20 and solder balls 60 reflowed to form an electrically conductive bond between pads 40 and solder balls 60 using conventional flip chip bonding methods.

After reflow, all voids between the interior surfaces of recesses 20 and die 50 are under-filled with a suitable under-fill material 62 such as Epoxyset 3131 as shown in FIG. 5 and cured per manufacture's specifications. Ultraviolet light curing is possible if a transparent glass substrate is used.

Figure 6:
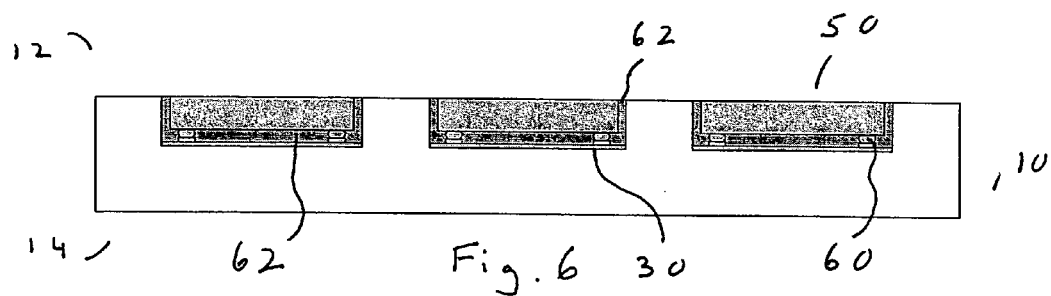
FIG. 6 shows a cross-section of the invention after planarizing.

Turning to FIG. 6, first surface 12 is planerized preferably using chemical-mechanical polishing or any other suitable method. Note the flip chip bond and under-fill act as a stress relief during this stage of processing.

Figure 7:
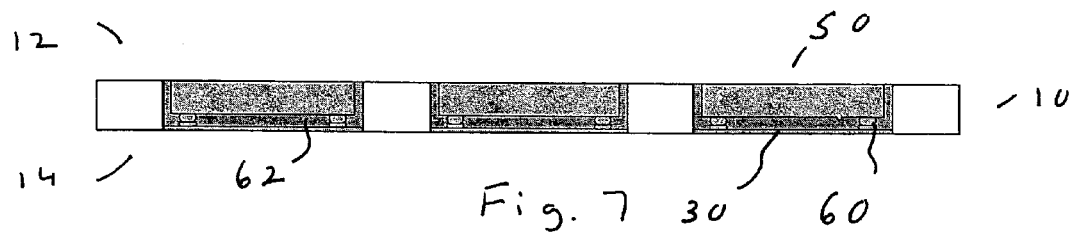
FIG. 7 shows a cross-section of the invention after back-thinning.

As seen in FIG. 7, a predetermined portion of second surface 14 is then removed using chemical and/or mechanical lapping so as to expose dielectric 30. The result of the planarization and back-thinning of substrate 10 is a neo-wafer with a thickness substantially that of the sum of the die thickness and solder ball diameter.

Figure 8:
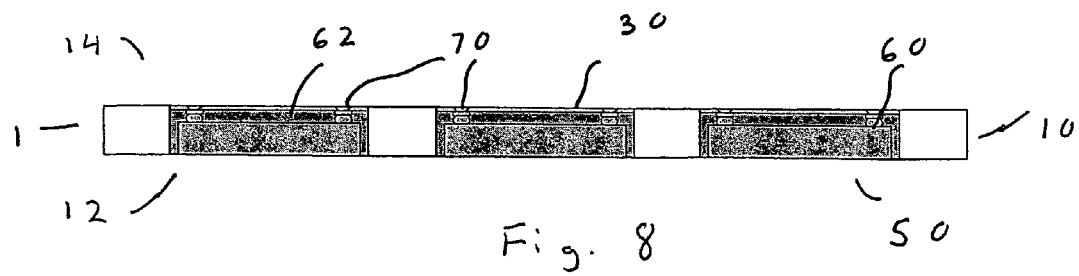
FIG. 8 shows a cross section of the invention after via formation.

As is shown in FIG. 8, vias 70 are then formed in dielectric 30 to provide electrical contact to desired I/O (input/output) pads on each die 50, resulting in a neo-wafer 71 incorporating previously singulated die which is of industry-standard diameter and thickness that can be processed using conventional wafer processing techniques.

An alternative embodiment of the invention relates to the formation of high tolerance, high density recesses for the receiving of one or more singulated die in a neo-wafer with desired minimum sidewall thickness is disclosed in FIGS. 9–17.

Figure 9:
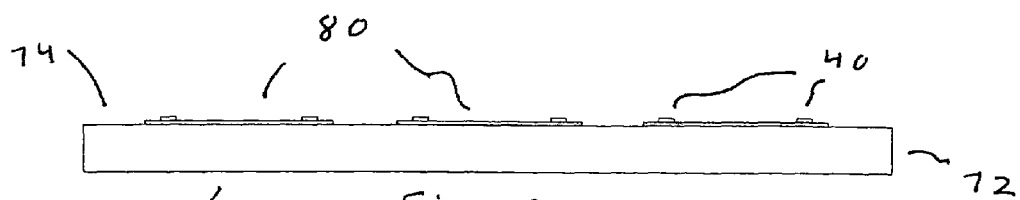
FIG. 9 shows a cross-section of an alternative embodiment of the invention showing a first layer with dielectric structures and conductive pads thereon.

As FIG. 9 illustrates, a first layer 72, with an upper surface 74 and a lower surface 76 is provided with the desired neo-wafer diameter. First layer 72 is preferably made of glass or similar material. Generally die-shaped dielectric structures 80 for the receiving of singulated die are formed on upper surface 74 with a length and width slightly greater than that of the die to be disposed thereon. Conductive pads 40 are formed on dielectric structures 80 for the subsequent interconnection of solder balls.

Figure 10:
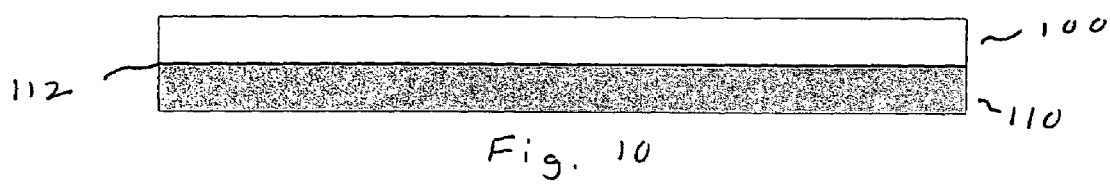
FIG. 10 shows a cross-section of an alternative embodiment of the invention illustrating a second layer and a third layer bonded together with an adhesive.

Turning now to FIG. 10, a base structure 90 is formed by bonding a second layer 100, and a third layer 110, using a suitable adhesive 112 that is capable of withstanding wafer processes. Second layer 100 and third layer 110 should be approximately of the same diameter as that of first layer 72. Second layer 100 is preferable a glass material and third layer 110 is preferably a silicon material. Alternative embodiments include the use of a first layer of aluminum and a second layer of silicon.

Figure 11:
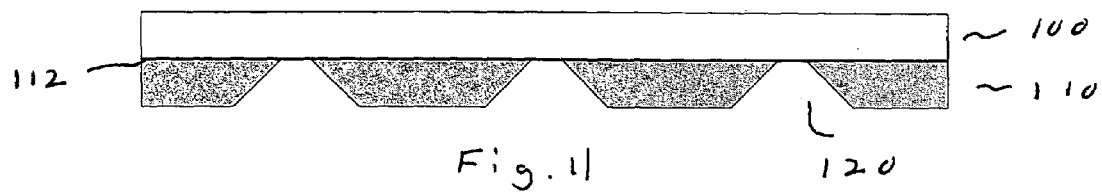
FIGS. 11–13 show cross-sections of an alternative embodiment of the invention with predetermined portions of the second and third layer removed.
Figure 12:
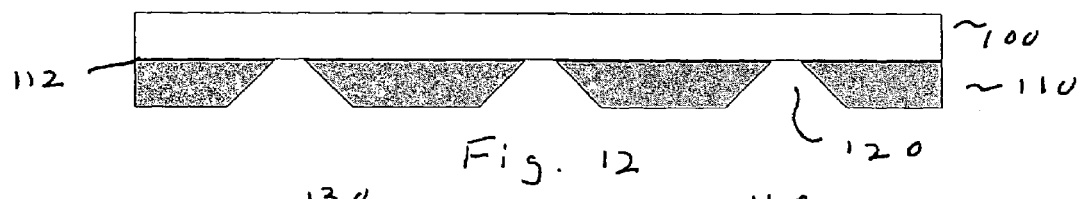
Figure 13:
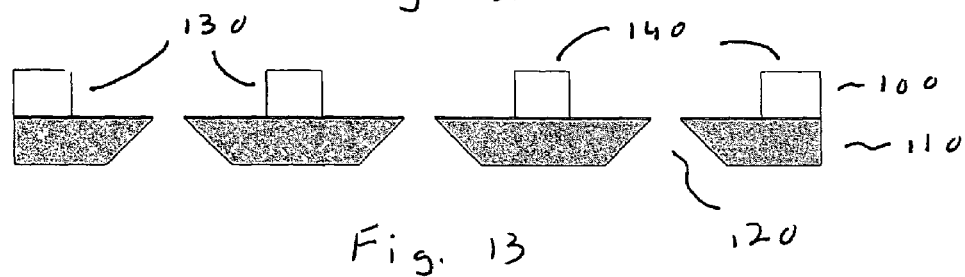

As can be seen in FIGS. 11–13, cavities 120 are formed in third layer 110 at a pitch approximately central to dielectric structures 80 and exposed adhesive 112 is removed.

Second layer 100 is subsequently etched so as to create very thin sidewall structures 130. In this configuration, third layer 110 acts as a sacrificial sidewall carrier and allows the creation of high tolerance sidewalls from second layer 100. The height, thickness, length and with of sidewalls 130 are such that the recesses 20 created thereby will receive dielectric structures 80.

Figure 14:
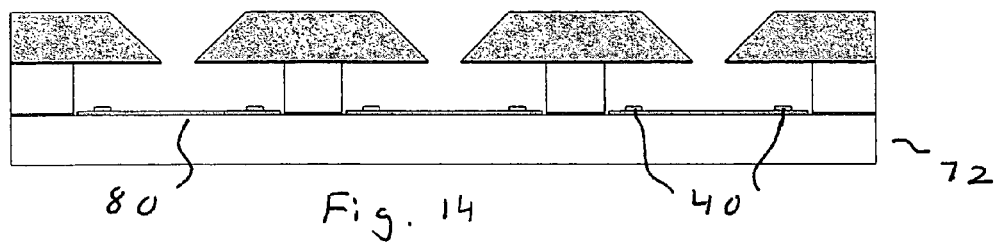
FIGS. 14–15 show cross-sections of an alternative embodiment of the invention illustrating the bonding of the first and second layers.

The uppermost sidewall surfaces 140 are precisely aligned and bonded to first layer 72 so that dielectric structures 80 are oriented and disposed within recesses 20 as seen in FIG. 14.

Figure 15:
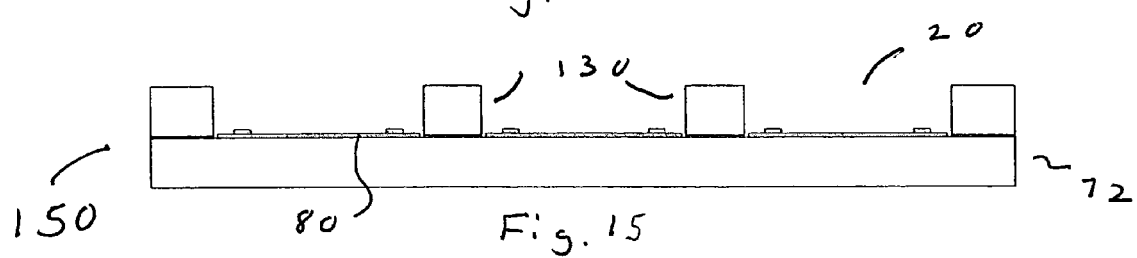

FIG. 15 shows the step where the remaining portions of third layer 110 and any remaining adhesive have been selectively removed so as to result in a high density, high tolerance sidewall structure 150 for the receiving of singulated die within recesses 20.

Figure 16:
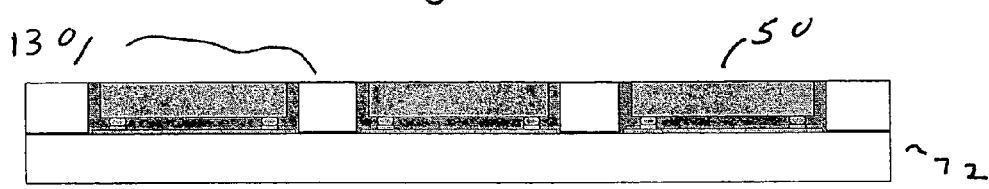
FIGS. 16–17 show a cross-section of an alternative embodiment of the invention with previously singulated die disposed within the recesses after planarizing, back-thinning and via formation.
Figure 17:
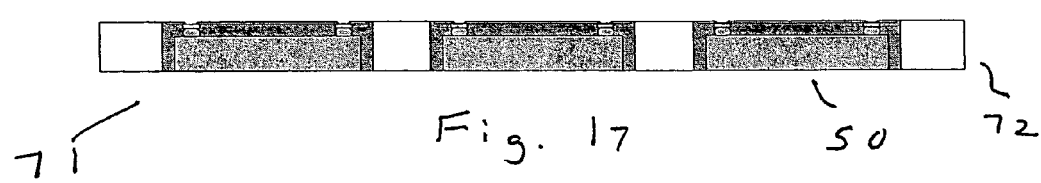

As seen in FIGS. 16 and 17, singulated die are flip chip bonded, under-filled within recesses 20, and the bonded first layer 72 and sidewalls 130 planarized, back-thinned and vias exposed to form a neo-wafer 71 of previously singulated die.

In each of the embodiments disclosed above, yet a further embodiment includes the elimination of the dielectric layer and for creation of conductive pads directly on the substrate or first layer. In this embodiment, the substrate or first layer is removed until the pads are exposed.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

I claim:

1. A method for creating a neo-wafer comprising: providing a first layer with an upper surface and a lower surface, forming at least one dielectric structure on said upper surface, forming at least one conductive pad on said at least one dielectric structure, providing a second layer and a third layer, bonding said second layer to said third layer with a first adhesive, removing a predetermined portion of said third layer so as to expose a predetermined portion of said first adhesive, removing said exposed predetermined portion of said first adhesive, removing a predetermined portion of said second layer to form at least one sidewall structure with an uppermost surface, bonding said uppermost sidewall surface to said upper surface of said first layer with a second adhesive whereby said at least one dielectric structure is disposed within said at least one sidewall structure to form at least one recess, removing the remaining portion of said third layer, removing the remaining portion of said first adhesive, disposing an integrated circuit die within said at least one recess, said integrated circuit die having at least one I/O pad, and forming an electrical interconnection between said conductive pad and said at least one I/O pad.

2. The method according to claim 1 comprised of the further step of substantially filling the volume between said die and said at least one recess with an under-fill material.

3. The method according to claim 2 comprised of the further step of removing a predetermined portion of said upper surface whereby said upper surface is planarized.

4. The method according to claim 3 comprised of the further step of removing a predetermined portion of said lower surface whereby said dielectric layer is exposed.

5. The method according to claim 4 comprised of the further step of forming at least one via in said dielectric layer so as to expose said at least one conductive pad.

6. The method according to claim 5 wherein said at least one I/O pad includes a solder ball disposed thereon.

* * * * *